US008112731B1

(12) United States Patent
Shen et al.

(10) Patent No.: US 8,112,731 B1
(45) Date of Patent: Feb. 7, 2012

(54) CONGESTION-DRIVEN PLACEMENT SYSTEMS AND METHODS FOR PROGRAMMABLE LOGIC DEVICES

(75) Inventors: Yinan Shen, Sunnyvale, CA (US); Chih-Chung Chen, Palo Alto, CA (US); Bo Wang, Shanghai (CN)

(73) Assignee: Lattice Semiconductor Corporation, Hillsboro, OR (US)

( * ) Notice: Subject to any disclaimer, the term of this patent is extended or adjusted under 35 U.S.C. 154(b) by 678 days.

(21) Appl. No.: 12/277,217

(22) Filed: Nov. 24, 2008

(51) Int. Cl.
*G06F 17/50* (2006.01)

(52) U.S. Cl. ......................................................... 716/116

(58) Field of Classification Search .................. 716/116
See application file for complete search history.

(56) References Cited

U.S. PATENT DOCUMENTS

| | | | |
|---|---|---|---|
| 5,648,913 A | 7/1997 | Bennett et al. | |
| 5,659,484 A | 8/1997 | Bennett et al. | |
| 5,659,717 A * | 8/1997 | Tse et al. ....................... | 716/122 |
| 6,099,583 A * | 8/2000 | Nag ............................... | 716/117 |
| 6,779,169 B1 * | 8/2004 | Singh et al. .................... | 716/113 |
| 6,813,754 B2 | 11/2004 | Wu et al. | |
| 6,851,101 B1 * | 2/2005 | Kong et al. .................... | 716/128 |
| 7,143,378 B1 | 11/2006 | Nag | |
| 7,146,590 B1 | 12/2006 | Chaudhary | |
| 7,146,900 B1 | 12/2006 | Chaudhary | |
| 7,210,115 B1 | 4/2007 | Rahim et al. | |
| 7,428,721 B2 * | 9/2008 | Rohe et al. .................... | 716/138 |
| 7,853,916 B1 * | 12/2010 | Trimberger et al. .......... | 716/117 |

OTHER PUBLICATIONS

Kannan et al., On Metrics for Comparing Routability Estimation Methods for FPGAs, ACM, Jun. 10, 2002, 6 pages.

Lou et al., Estimating Routing Congestion using Probabilistic Analysis, ACM, Apr. 1, 2001, pp. 112-117.
Sherwani, Naveed, Algorithms for VLSI Physical Design Automation, Second Edition, 1995, pp. 177-186.
Chih-liang Eric Cheng, RISA: Accurate and Efficient Placement Routability Modeling, ACM, 1994, pp. 690-695.
Li et al., Routability-Driven Placement and White Space Allocation, IEEE, 2004, pp. 394-401.
Wang et al., Congestion Minimization During Placement, IEEE Transactions on Computer-Aided Design of Integrated Circuits and Systems, vol. 19, No. 10, Oct. 2000, pp. 1140-1148.
Kirkpatrick et al., Optimization by Simulated Annealing, Science, vol. 220, No. 4598, May 13, 1983, pp. 671-680.

(Continued)

*Primary Examiner* — Jack Chiang
*Assistant Examiner* — Brandon Bowers
(74) *Attorney, Agent, or Firm* — Haynes and Boone, LLP

(57) ABSTRACT

Techniques are provided for reducing signal congestion in programmable logic devices (PLDs). In one example, a computer-implemented method of reducing signal congestion in a configuration of a PLD includes mapping a plurality of circuit components of a circuit design to a plurality of components of the PLD, wherein each of the mapped PLD components is associated with one of a plurality of regions of the PLD and with one or more unique signal paths entering the PLD region. The method also includes determining a cost value for each PLD region based at least in part on the number of unique signal paths entering the PLD region from other PLD regions. The method also includes selecting one of the PLD components to move from a first one of the PLD regions to a second one of the PLD regions. The method also includes updating the cost values associated with the first and second PLD regions based on a change in the number of unique signal paths entering the first and second PLD regions. The method also includes selectively accepting or rejecting the move based at least in part on the updated cost values.

20 Claims, 9 Drawing Sheets

OTHER PUBLICATIONS

Parthasarathy et al., Interconnect Complexity-Aware FPGA Placement Using Rent's Rule, ACM, Mar. 31, 2001, pp. 115-121.

Yeager et al., Congestion Estimation and Localization in FPGAs: A Visual Tool for Interconnect Prediction, ACM, Mar. 17, 2007, pp. 33-40.

Zhuo et al., A Congestion Driven-Placement Algorithm for FPGA Synthesis, Department of Computer Science and Engineering, University of North Texas, 4 pages.

Cong et al., Large-Scale Circuit Placement: Gap and Promise, Proceedings of the International Conference on Computer Aided Design (ICCAD'03), ACM, 2003, pp. 883-890.

Kong, Tim, A Novel Net Weighting Algorithm for Timing-Driven Placement, IEEE, 2002, pp. 172-176.

Ren et al., Sensitivity Guided Net Weighting for Placement Driven Synthesis, ACM, 2004, pp. 10-17.

Zhuo et al., New Timing and Routability Driven Placement Algorithms for FPGA Synthesis, ACM, 2007, pp. 570-575.

\* cited by examiner

CONGESTION-DRIVEN PLACEMENT SYSTEMS AND METHODS FOR PROGRAMMABLE LOGIC DEVICES

TECHNICAL FIELD

The present invention relates generally to programmable logic devices and, more particularly for example, to congestion-driven placement techniques for programmable logic devices.

BACKGROUND

Programmable logic devices (PLDs), such as field programmable gate arrays (FPGAs) or complex programmable logic devices (CPLDs), may be configured to provide user-defined features. PLDs typically include various components, such as programmable logic cells, memory cells, digital signal processing cells, input/output cells, and other components. The PLD components may be interconnected through signal paths provided by routing wires of the PLD to implement a desired circuit design.

However, PLDs typically have a limited supply of routing wires available to interconnect components from different portions of the PLD. This differs from conventional application-specific integrated circuits (ASICs) in which empty physical spaces may be reserved to implement additional signal paths at a later time if desired. Thus, if a given circuit design requires too many signals to be interconnected between certain regions of a PLD, the limited number of available signal paths may become nearly or completely exhausted, leading to congestion in the PLD signal paths. This can be especially problematic for PLDs with large cell sizes that may require correspondingly large numbers of interconnected signal paths. Therefore, the placement of components in a PLD (e.g., the position of various PLD components used to implement a circuit design) is an important PLD design consideration.

Unfortunately, existing approaches to determining PLD congestion are often unsatisfactory. For example, in one approach, rough approximations of routing resource requirements are used in order to save time and computing resources. However, the use of such approximations can result in considerably inaccurate routing resource calculations. In another approach, PLD congestion is frequently recalculated to improve the quality of results. Nevertheless, this alternative approach requires long computing times and significant computing resource commitments which can become cost-prohibitive and impractical for large PLD designs. Accordingly, there is a need for an improved approach to determining the placement of components in PLDs.

SUMMARY

In accordance with one embodiment of the present invention, a computer-implemented method of reducing signal congestion in a configuration of a programmable logic device (PLD) includes mapping a plurality of circuit components of a circuit design to a plurality of components of the PLD, wherein each of the mapped PLD components is associated with one of a plurality of regions of the PLD and with one or more unique signal paths entering the PLD region; determining a cost value for each PLD region based at least in part on the number of unique signal paths entering the PLD region from other PLD regions; selecting one of the PLD components to move from a first one of the PLD regions to a second one of the PLD regions; updating the cost values associated with the first and second PLD regions based on a change in the number of unique signal paths entering the first and second PLD regions; and selectively accepting or rejecting the move based at least in part on the updated cost values.

In accordance with another embodiment of the present invention, a system includes one or more processors; and one or more memories adapted to store a plurality of computer readable instructions which when executed by the one or more processors are adapted to cause the system to perform a method of reducing signal congestion in a configuration of a programmable logic device (PLD), the method comprising: mapping a plurality of circuit components of a circuit design to a plurality of components of the PLD, wherein each of the mapped PLD components is associated with one of a plurality of regions of the PLD and with one or more unique signal paths entering the PLD region, determining a cost value for each PLD region based at least in part on the number of unique signal paths entering the PLD region from other PLD regions, selecting one of the PLD components to move from a first one of the PLD regions to a second one of the PLD regions, updating the cost values associated with the first and second PLD regions based on a change in the number of unique signal paths entering the first and second PLD regions, and selectively accepting or rejecting the move based at least in part on the updated cost values.

In accordance with another embodiment of the present invention, a system for reducing signal congestion in a configuration of a programmable logic device (PLD) includes means for mapping a plurality of circuit components of a circuit design to a plurality of components of the PLD, wherein each of the mapped PLD components is associated with one of a plurality of regions of the PLD and with one or more unique signal paths entering the PLD region; means for determining a cost value for each PLD region based at least in part on the number of unique signal paths entering the PLD region from other PLD regions; means for selecting one of the PLD components to move from a first one of the PLD regions to a second one of the PLD regions; means for updating the cost values associated with the first and second PLD regions based on a change in the number of unique signal paths entering the first and second PLD regions; and means for selectively accepting or rejecting the move based at least in part on the updated cost values.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

In accordance with various techniques described herein, a simulated annealing process can be used to efficiently implement a circuit design in a PLD in a manner that reduces possible signal congestion in the PLD. In one embodiment, circuit components of the circuit design can be mapped to a plurality of PLD components which are initially placed in various regions of the PLD. The placement of the PLD components in the various regions can then be adjusted based on region-specific cost values that are determined at least in part by the number of signal paths associated with each region.

In another embodiment, a congestion density estimate may be determined for each PLD region. In this regard, the cost value for each region may be further determined based on the congestion density estimate associated with each PLD region. In yet another embodiment, the cost values may be updated based on the number of signal paths associated with each region and may be updated more frequently than the congestion density estimates.

Figure 1:
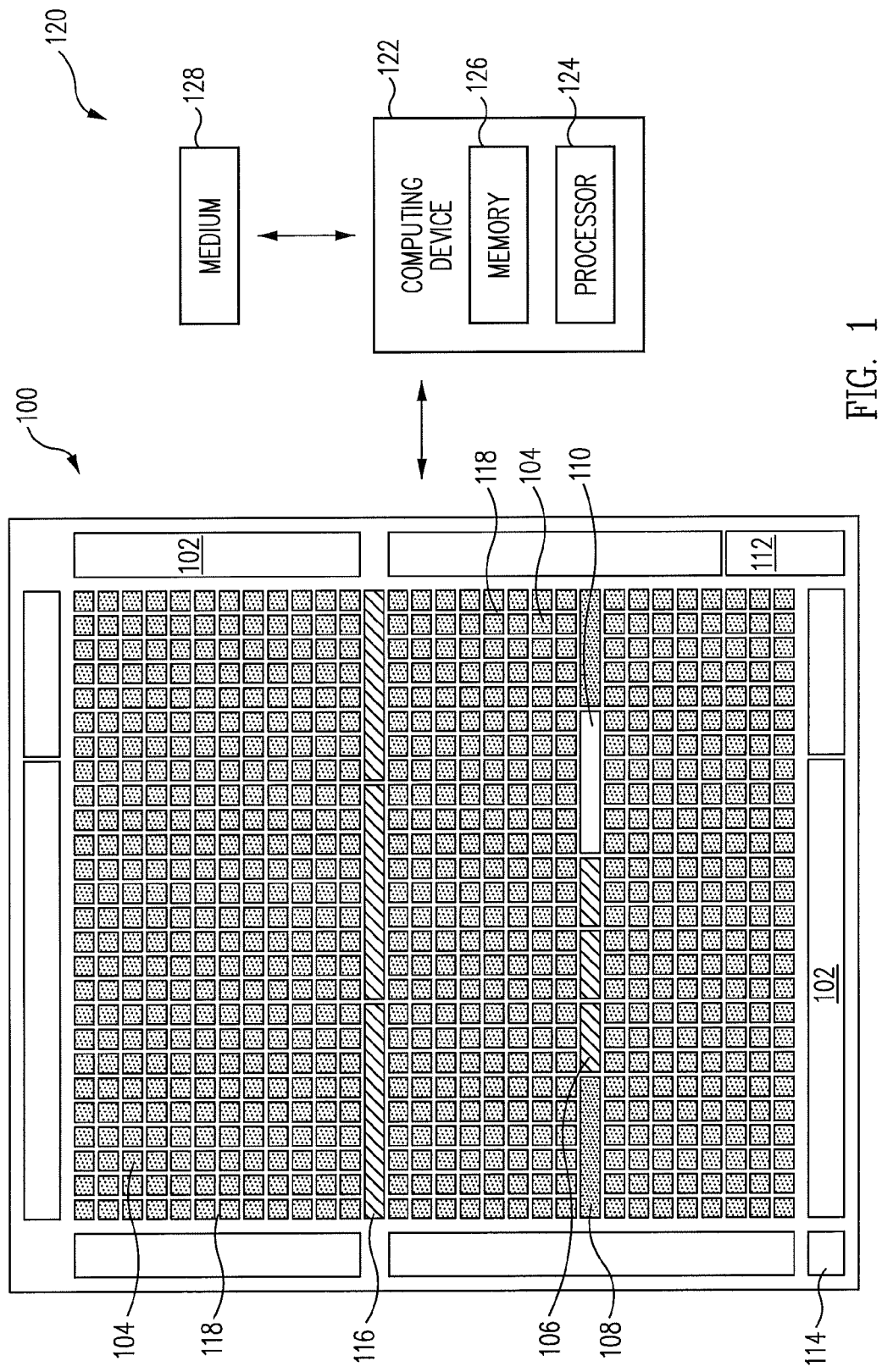
FIG. 1 illustrates a block diagram of a programmable logic device (PLD) and a system for generating configuration data for use with the PLD in accordance with an embodiment of the invention.

FIG. 1 illustrates a block diagram of a programmable logic device (PLD) 100 and a system 120 for generating configuration data for use with PLD 100 in accordance with an embodiment of the invention. In one embodiment, PLD 100 may be implemented as a PLD in the ECP2/M family of devices available from Lattice Semiconductor Corporation of Hillsboro, Oreg.

PLD 100 (e.g., a field programmable gate array (FPGA), a complex programmable logic device (CPLD), a field programmable system on a chip (FPSC), or other type of programmable device) generally includes input/output (I/O) blocks 102 and logic blocks 104 (e.g., also referred to as programmable logic blocks (PLBs), programmable functional units (PFUs), or programmable logic cells (PLCs)). I/O blocks 102 provide I/O functionality (e.g., to support one or more I/O and/or memory interface standards) for PLD 100, while programmable logic blocks 104 provide logic functionality (e.g., LUT-based logic or logic gate array-based logic) for PLD 100.

PLD 100 may also include blocks of memory 106 (e.g., blocks of EEPROM, block SRAM, and/or flash memory), clock-related circuitry 108 (e.g., PLL and/or DLL circuits), configuration logic 110 (e.g., for startup, decryption, encryption, multiple-boot support (e.g., dual boot support), and/or error detection), a configuration port 112, configuration memory 114, special function blocks 116 (e.g., digital signal processing (DSP) blocks or other forms of multiply and accumulate circuit functionality), and/or routing resources 118. In general, the various elements of PLD 100 may be used to perform their intended functions for the desired application, as would be understood by one skilled in the art.

For example, configuration port 112 may be used for programming PLD 100, such as memory 106 and/or configuration memory 114 or transferring information (e.g., various types of data and/or control signals) to/from PLD 100 as would be understood by one skilled in the art. For example, configuration port 112 may include a first programming port (which may represent a central processing unit (CPU) port, a peripheral data port, a serial peripheral interface, and/or a sysCONFIG programming port) and/or a second programming port such as a joint test action group (JTAG) port (e.g., by employing standards such as Institute of Electrical and Electronics Engineers (IEEE) 1149.1 or 1532 standards). Configuration port 112 typically, for example, may be included to receive configuration data and commands to support serial or parallel device configuration and information transfer.

It should be understood that the number and placement of the various elements, such as I/O blocks 102, logic blocks 104, memory 106, clock-related circuitry 108, configuration logic 110, configuration port 112, configuration memory 114, special function blocks 116, and routing resources 118, are not limiting and may depend upon the desired application. For example, special function blocks 116 are optional and various other elements may not be required for a desired application or design specification (e.g., for the type of programmable device selected).

Furthermore, it should be understood that the elements are illustrated in block form for clarity and that certain elements, such as for example configuration memory 114 or routing resources 118, would typically be distributed throughout PLD 100, such as in and between logic blocks 104, to perform their conventional functions (e.g., storing configuration data that configures PLD 100 or providing interconnect structure within PLD 100, respectively). It should also be understood that the various embodiments of the present invention as disclosed herein are not limited to programmable logic devices, such as PLD 100, and may be applied to various other types of programmable devices, as would be understood by one skilled in the art.

System 120 includes a computing device 122 and a computer readable medium 128. As shown, computing device 122 includes a processor 124 and a memory 126. Processor 124 may be configured with appropriate software (e.g., a computer program for execution by a computer) that is stored on computer readable medium 128 and/or in memory 126 to instruct processor 124 to perform one or more of the operations described herein. In one embodiment, such software may be implemented as ispLEVER 7.1 software available from Lattice Semiconductor Corporation of Hillsboro, Oreg.

In one embodiment, means such as processor 124 configured with such software may be used for mapping a plurality of circuit components of a circuit design to a plurality of components of the PLD (wherein each of the mapped PLD components is associated with one of a plurality of regions of the PLD and with one or more unique signal paths entering the PLD region), determining a cost value for each PLD region based at least in part on the number of unique signal paths entering the PLD region from other PLD regions, selecting one of the PLD components to move from a first one of the PLD regions to a second one of the PLD regions, updating the cost values associated with the first and second PLD regions based on a change in the number of unique signal paths entering the first and second PLD regions, and selectively accepting or rejecting the move based at least in part on the updated cost values. In another embodiment, means such as processor 124 configured with such software may be further used for assigning a cost value to each PLD region having a number of signal paths that exceeds a signal path limit value associated with the PLD region.

Processor 124 and memory 126 may be implemented in accordance with any appropriate components that may be used to provide computing system 120. Similarly, computer readable medium 128 may be implemented using any appropriate type of machine-readable medium used to store software. System 120 may be implemented to provide configuration data prepared by system 120 to PLD 100 through, for example, configuration port 112.

Figure 2:
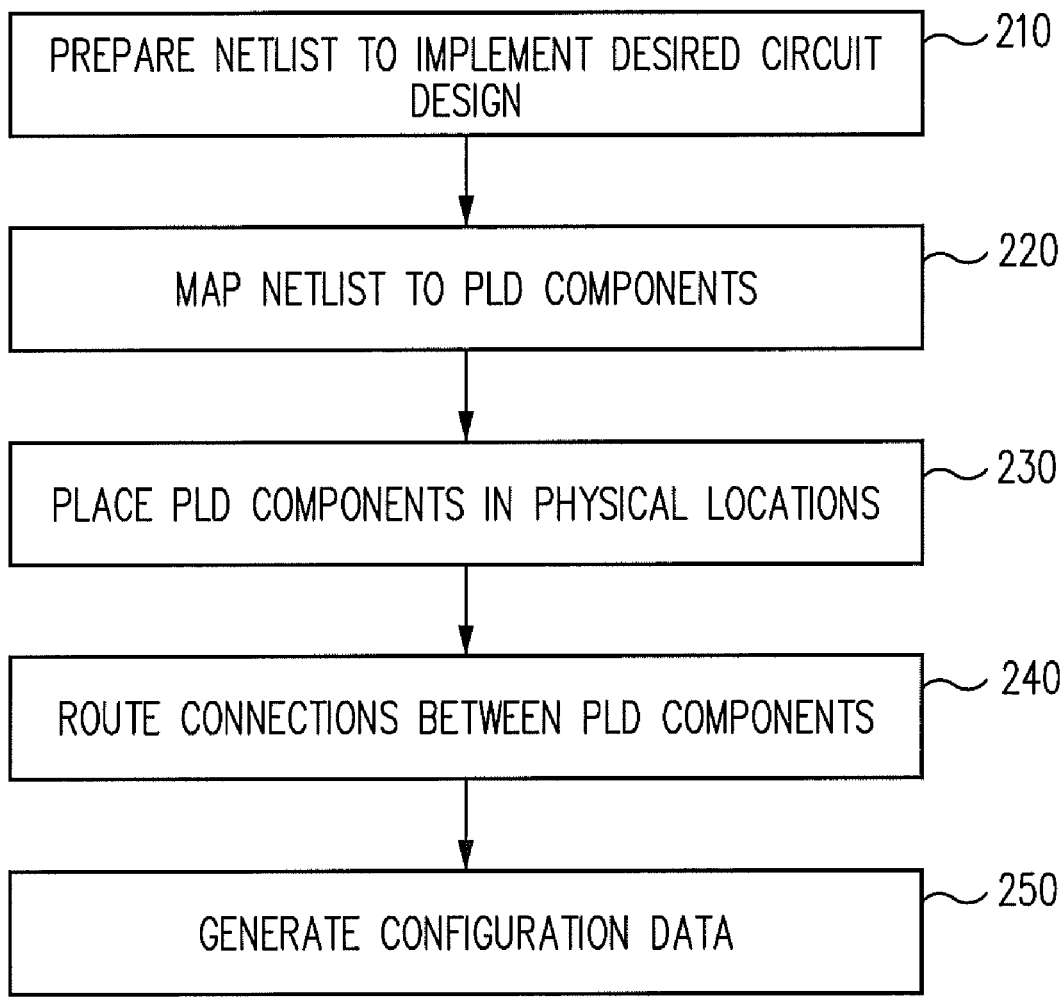
FIG. 2 illustrates a process of preparing a circuit design for implementation in a PLD in accordance with an embodiment of the invention.

FIG. 2 illustrates a process of preparing a circuit design for implementation in a PLD in accordance with an embodiment of the invention. For example, in one embodiment, the process of FIG. 2 may be performed by system 120 to prepare a circuit design for implementation in PLD 100 of FIG. 1.

In step 210, system 120 prepares a netlist of circuit components of the circuit design. For example, in various embodiments, the netlist of step 210 may correspond to a user-prepared or machine-prepared circuit design specifying connections between circuit components of the circuit design to be programmed into PLD 100.

In steps 220, 230, and 240, system 120 performs map, place, and route operations, respectively, using the netlist of step 210. Specifically, in step 220, the circuit components in the netlist of step 210 are mapped to particular types of components of PLD 100 such as, for example, I/O blocks, logic blocks, memory, clock-related circuitry, special function blocks, and/or other types of components. In this regard, the PLD components may be programmed to implement the functionality of the circuit components of the circuit design.

In step 230, the PLD components mapped in step 220 are placed in physical locations of PLD 100 having such components. For example, during step 230, system 120 may select which of the I/O blocks 102, logic blocks 104, memory 106, clock-related circuitry 108, special function blocks 116, and/or other components of PLD 100 are to be used to implement the particular PLD components mapped to the netlist in step 220. Various implementations of step 230 are further described herein with regard to FIGS. 3 and 4A-E.

In step 240, connections are routed between the PLD components placed in step 220. For example, in one embodiment, particular routing resources 118 can be identified in step 240 to interconnect the PLD components through appropriate signal paths.

In step 250, configuration data is generated corresponding to the mapped, placed, and routed design. When loaded into appropriate configuration memory (e.g., configuration memory 114) of PLD 100, this configuration data causes PLD 100 to implement the desired circuit design.

Figure 3:
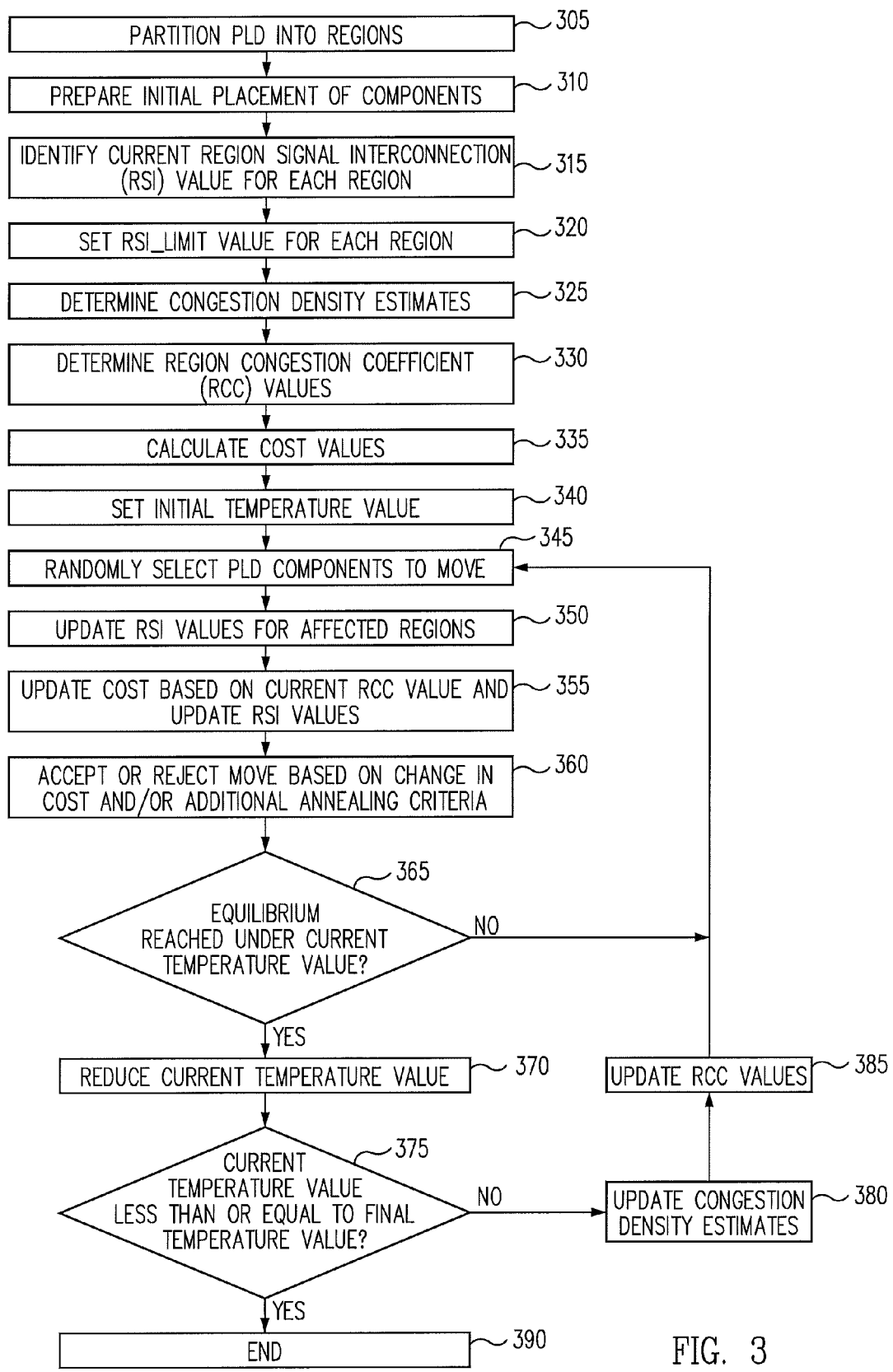
FIG. 3 illustrates a process for placing PLD components in various regions of a PLD in accordance with an embodiment of the invention.

FIG. 3 illustrates a process for placing PLD components in various regions of PLD 100 in accordance with an embodiment of the invention. For example, in one embodiment, the process of FIG. 3 may be performed by system 120 during step 230 of the process of FIG. 2.

During the process of FIG. 3, cost values are determined for different regions of PLD 100 to denote the level of signal congestion experienced by each PLD region relative to other PLD regions of PLD 100. In accordance with a simulated annealing process, the placement of different PLD components can be randomly adjusted by system 120. System 120 can selectively accept or reject the adjusted placements based on changes in the cost values resulting from the adjustments and/or additional annealing criteria as further discussed herein.

In step 305, system 120 partitions PLD 100 into a plurality of PLD regions, each of which may include one or more PLD components. In this regard, each PLD region corresponds to a physical region of PLD 100 that may include a single type of PLD component (e.g., homogeneous), or may include different types of PLD components (e.g., heterogeneous). The size of the PLD regions may be based on various criteria such as, for example, the architecture of PLD 100 (e.g., the types of PLD components in each PLD region or the physical layout of PLD 100) or other criteria.

Figure 4A:
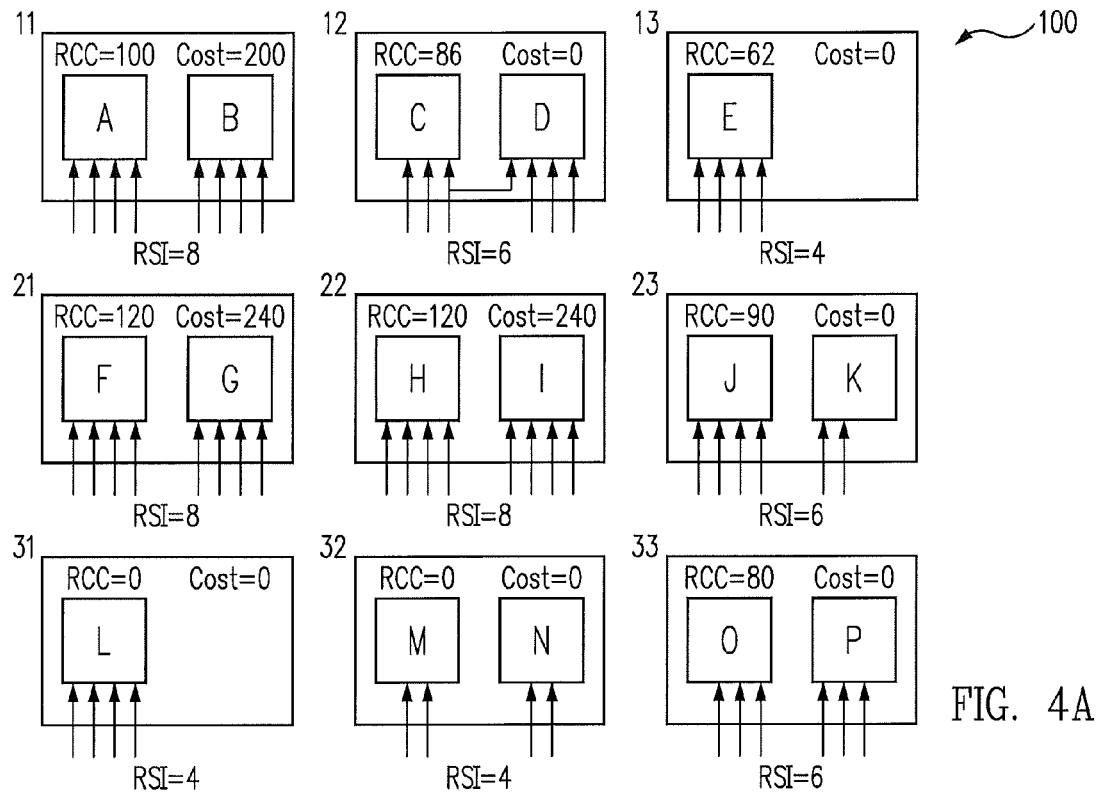
FIGS. 4A-E illustrate examples of various placements of PLD components during the process of FIG. 3 in accordance with embodiments of the invention.

In step 310, system 120 prepares an initial placement of PLD components. In this regard, the PLD components mapped in step 220 are assigned to particular PLD regions of PLD 100. For example, FIG. 4A illustrates an example of an initial placement of PLD components in PLD regions as a result of step 310. As shown in FIG. 4A, PLD 100 is represented conceptually as being partitioned into a plurality of PLD regions 11-13, 21-23, and 31-33 having various placed PLD components A-P. Although only a limited number of PLD regions and PLD components are shown in FIG. 4A, any desired number of PLD regions and/or PLD components may be used.

In step 315, system 120 determines the number of unique signal paths associated with each PLD region as a result of the initial placement. As shown in FIG. 4A, for example, the initial placement of PLD components A-P results in various signal paths entering PLD regions 11-13, 21-23, and 31-33 from other regions.

The number of unique signal paths entering a PLD region from other regions is also referred to as a region signal interconnection (RSI) value. In one embodiment, PLD 100 may be implemented to support an RSI value as high as 40 for each region, with typical RSI values being much lower in most cases.

In the example illustrated in FIG. 4A, the RSI value for each PLD region is shown. For example, PLD region 11 has an RSI value of 8 corresponding to the total number of unique signal paths provided to PLD region 11. Specifically, four unique signal paths are provided to each of PLD components A and B in region 11.

As another example, PLD region 12 has an RSI value of 6 corresponding to the total number of unique signal paths provided to PLD region 12. Specifically, three unique signal paths are provided to each of PLD components C and D therein. Although one signal path connects to both of PLD components C and D, it stems from a single unique signal path entering PLD region 12 and therefore only counts as one unique signal path toward the RSI value for PLD region 12.

In step 320, system 120 sets an RSI_limit value for each PLD region. In one embodiment, the RSI_limit value is a constant value which sets the maximum number of unique signal paths allowed for a PLD region without cost (i.e., a zero cost value). If the RSI_limit value is exceeded, a nonzero cost value is assigned to the PLD region. The RSI_limit value may be selected, for example, based on the routing resources available for each PLD region, the size of each PLD region, and/or the types of programmable components available in each PLD region. For example, the RSI_limit value for a PLD region with significant routing resources may be set higher than the RSI_limit value for a PLD region with limited routing resources (e.g., a PLD region capable of receiving only a small number of signal paths). In this regard, for PLD regions where no congestion is expected, the RSI_limit value may be set to infinity and only a zero cost value will be assigned to such a PLD region. In one embodiment, the RSI_limit value may be set to a value of 20 if each PLD region includes only a single programmable logic cell.

In the example shown in FIG. 4A, if an RSI_limit value of 6 is set for each PLD region, then all PLD regions having an RSI value greater than 6 (e.g., PLD regions 11, 21, and 22) will be assigned a cost value greater than zero. All remaining PLD regions (e.g., PLD regions 12, 13, 23, 31, 32, and 33) will be assigned a cost value of zero. Cost values will be further described herein with regard to step 350.

In step 325, system 120 prepares a congestion density map for PLD. For example, the congestion density map may be implemented as an array of congestion density estimates associated with particular PLD regions. In this regard, system 120 calculates a congestion density estimate for each PLD region. In one embodiment, congestion density estimates may be determined in accordance with conventional congestion estimation techniques that will be familiar to those skilled in the art, such as bounding box techniques. In another embodiment, congestion density estimates may be determined in accordance with trunk routing techniques further described herein with regard to FIGS. 5 and 6A-C. In yet another embodiment, a congestion density estimate may be determined for each PLD region using the ratio of: the estimated number of signal paths required by the programmable components currently associated with the PLD region; and the total number of signal paths available in the PLD region.

The following Table 1 illustrates a sample congestion density map which identifies congestion density estimates obtained using any of the above-identified techniques for the PLD regions shown in FIG. 4A:

TABLE 1

| 80 | 73 | 61 |
|----|----|----|
| 99 | 92 | 75 |
| 32 | 39 | 70 |

In this regard, the first row of Table 1 corresponds to congestion density estimates for regions 11-13, the second row corresponds to congestion density estimates for regions 21-23, and the third row corresponds to congestion density estimates for regions 31-33.

In step 330, system 120 determines a congestion density value, also referred to as a region congestion coefficient (RCC) value, for each PLD region based on the congestion density map previously prepared in step 320. The RCC values are used to weight the cost values for each PLD region as further described herein. In one embodiment, the RCC value for each PLD region may be determined using one of the following equations:

$$\text{RCC value} = \text{max\_value}, \text{ if } D > D_{upper\_bound} \quad \text{(equation 1)}$$

$$\text{RCC value} = 0, \text{ if } D < D_{lower\_bound} \quad \text{(equation 2)}$$

$$\text{RCC value} = \text{min\_value} + (\text{max\_value} - \text{min\_value}) * (D - D_{lower\_bound}) / (D_{upper\_bound} - D_{lower\_bound}), \text{ if } D_{lower\_bound} \leq D \leq D_{upper\_bound} \quad \text{(equation 3)}$$

In equations 1-3, D is the congestion density estimate for a PLD region determined in step 320, $D_{upper\_bound}$ and $D_{lower\_bound}$ are constants which define the upper and lower bounds of congestion density estimate D, and max_value and min_value are constants which define the upper and lower bounds of nonzero RCC values. In various embodiments, the values of the constants used in equations 1-3 may be used to adjust the amount to which cost values are influenced by signal congestion.

Using the congestion density estimates prepared in step 325 and the constants identified in equations 1-3, system 120 can determine an RCC value for each PLD region in step 330. FIG. 4A illustrates RCC values calculated for each of PLD regions 11-13, 21-23, and 31-33. For example, if $D_{upper\_bound}$ is 90, $D_{lower\_bound}$ is 40, max_value is 120, and min_value is 20, then RCC values for regions 11, 21, and 31 may be calculated as set forth below.

For region 11, the congestion density estimate D is 80 as indicated in Table 1 above. Because the congestion density estimate is between $D_{upper\_bound}$ and $D_{lower\_bound}$ equation 3 is used as follows:

$$\text{RCC value of PLD region } 11 = 20 + (120-20) * (80-40) / (90-40) = 100 \quad \text{(equation 3.1)}$$

For region 21, the congestion density estimate D is 99 as indicated in Table 1 above. Because the congestion density estimate is greater than $D_{upper\_bound}$ equation 1 is used as follows:

$$\text{RCC value of PLD region } 21 = 120 \quad \text{(equation 1.1)}$$

For region 31, the congestion density estimate D is 32 as indicated in Table 1 above. Because the congestion density estimate is lower than $D_{lower\_bound}$, equation 2 is used as follows:

$$\text{RCC value of PLD region } 31 = 0 \quad \text{(equation 2.1)}$$

It will be appreciated that RCC values for the remaining regions of FIG. 4A may be determined using equations 1-3, Table 1, and the constant values identified above.

In step 335, system 120 determines a cost value for each PLD region. For example, in one embodiment, the cost value for each PLD region is determined using one of the following equations:

$$\text{cost value} = 0, \text{ if RSI} < \text{RSI\_limit} \quad \text{(equation 4)}$$

$$\text{cost value} = \text{RCC} * (\text{RSI} - \text{RSI\_limit}), \text{ if RSI} \geq \text{RSI\_limit} \quad \text{(equation 5)}$$

Also in step 335, the cost values of all PLD regions are summed to provide a total cost value for PLD 100.

FIG. 4A illustrates cost values calculated for each of PLD regions 11-13, 21-23, and 31-33, as well as the total cost value of PLD 100 (e.g., the total cost value is 680 in this embodiment). For example, assuming an RSI_limit value of 6, then the cost value for PLD region 11 can be determined as follows:

$$\text{cost value of PLD region } 11 = 100 * (8-6) = 200 \quad \text{(equation 6)}$$

As another example, if the RSI_limit value is still assumed to be 6, then the cost value for PLD region 31 will be zero because its RSI value of 4 is less than the RSI_limit value.

Although cost values associated with signal congestion have been discussed above, additional factors may be added in to the cost values in other embodiments. For example, in one embodiment, bounding box techniques may be used as such techniques are familiar to those skilled in the art. In another embodiment, signal timing estimates of critical signal paths may be used.

In steps 340 to 380, system 120 uses the values previously determined during the process of FIG. 3 in a simulated annealing process wherein one or more PLD components are randomly moved to different PLD regions. Cost values for the PLD regions associated with the differently-positioned PLD components are updated and the random moves are selectively accepted or rejected. In this regard, if a move is accepted, then the moved PLD components will remain in their newly moved positions. If a move is rejected, then the moved PLD components will be returned to their pre-move positions. Moves that increase the total cost value of PLD 100 may be accepted or rejected based on the total cost value of PLD 100, a temperature value of the simulated annealing process, and/or additional criteria.

As will be appreciated by those skilled in the art, a temperature value as understood in the context of a simulated annealing process is a parameter that is gradually reduced during the simulated annealing process toward a final temperature value. When the temperature value is at or near an initial maximum value, system 120 will accept moves even if such changes result in an increase in the total cost value of PLD 100. However, as the temperature value decreases, system 120 will be less and less likely to accept moves that increase the total cost value of PLD 100. When the final temperature value is reached, the simulated annealing process ends.

In step 340, system 120 sets an initial temperature value for the simulated annealing process. In step 345, system 120 randomly selects one or more PLD components to move from one PLD region to another PLD region. In step 350, system 120 updates the RSI values for the PLD regions affected by the move. In step 355, system 120 updates the cost values for the PLD regions affected by the move using the updated RSI values (determined in step 350) and the original RCC values (determined in step 330).

Figure 4B:
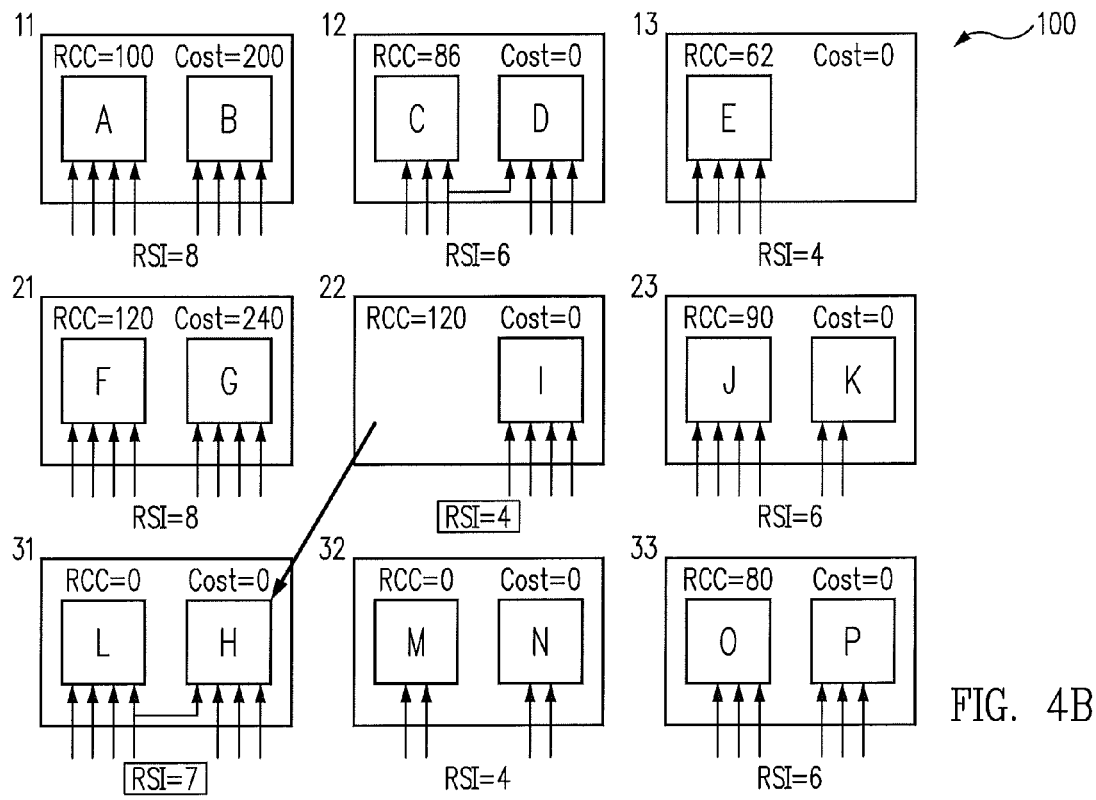

FIG. 4B illustrates an example of a placement of PLD components after steps 345-355 are performed on the previous example shown in FIG. 4A. As identified in FIG. 4B, programmable component H has been moved from PLD region 22 to PLD region 31 (step 345). As a result of the move, there are seven unique signal paths entering PLD region 31, and there are four unique signal paths entering PLD region 22. Accordingly, the RSI values for PLD regions 22 and 31 have been recalculated to be 4 and 7, respectively (step 350). Cost values for PLD regions 22 and 31 have also been recalculated using the updated RSI values and the original RCC values (step 355). As a result, the total cost value associated with PLD 100 has changed from 680 (FIG. 4A) to 440 (FIG. 4B).

Advantageously, by using the original RCC values during step 355, system 120 is not required to prepare any additional congestion density estimates in this step (e.g., congestion density estimates are used to prepare RCC values as shown in equations 1-3). In this regard, it will be appreciated that the preparation of congestion density estimates can be a computationally-intensive process. Because the approach described in step 355 does not require newly updated congestion density estimates to be prepared for every change in the positions of PLD components, significant time and processing resources can be saved during the process of FIG. 3.

In step 360, system 120 selectively accepts or rejects the move of step 345. For example, in one embodiment, system 120 may accept any move that results in a reduced total cost value for PLD 100. Accordingly, in such an embodiment, system 120 will accept the move illustrated in FIG. 4B. In another embodiment, system 120 may apply additional annealing criteria as further described herein.

In step 365, system 120 determines whether equilibrium has been reached during the process of FIG. 3 in accordance with simulated annealing techniques that will be familiar to those skilled in the art. For example, in one embodiment, equilibrium may be determined based on a fixed number of iterations of steps 345-365 (e.g., the steps may be repeated 18 times in the loop shown in FIG. 3).

This fixed number of iterations of steps 345-365 may be determined according to various techniques. For example, in one embodiment, system 120 may track the net change in total cost value for each iteration of steps 345-365. In this regard, system 120 may count the number of iterations required before the net change in the total cost value remains less than a desired value (e.g., remains less than 50) for at least a particular number of iterations (e.g., remains less than 50 for at least three iterations of steps 345-365). The total number of iterations of steps 345-365 required to reach this state (e.g., 18 iterations in this example) may thereafter be identified as the fixed number of iterations to be used in subsequent executions of steps 345-365. It will be appreciated that different equilibrium criteria may be used in other embodiments.

Referring again to FIG. 3, if equilibrium is reached, then the process continues to step 370. If equilibrium is not reached, then the process returns to step 345 and repeats steps 345-365.

Figure 4C:
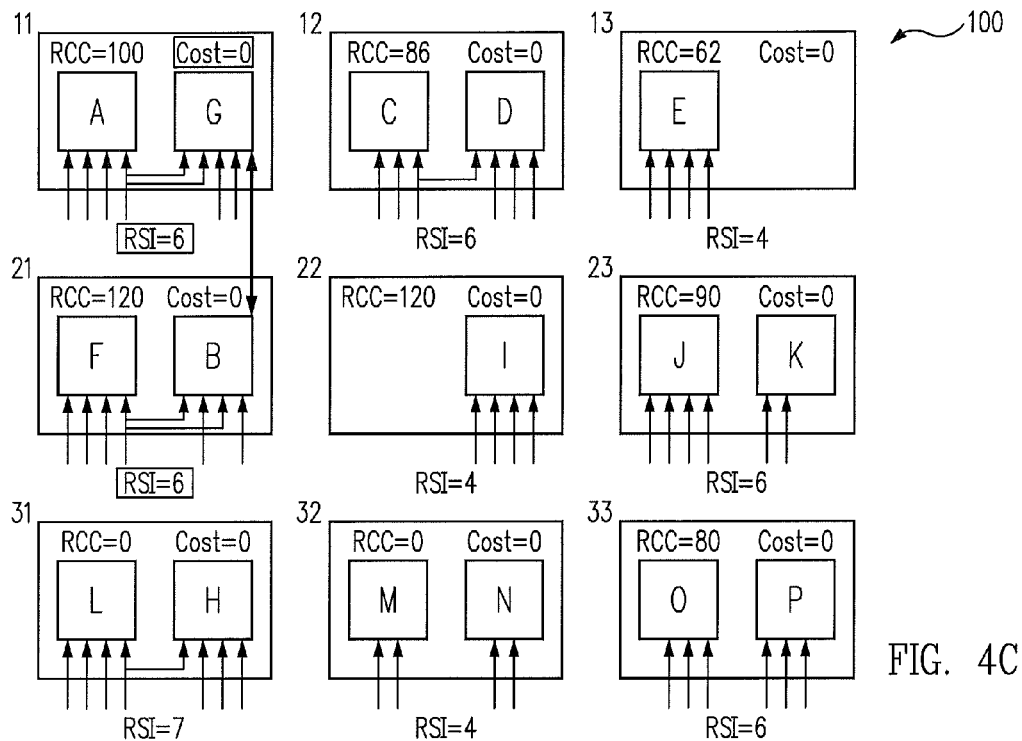

FIG. 4C illustrates an example of a placement of PLD components after an additional iteration of steps 345-355 is performed on the previous example shown in FIG. 4B. As identified in FIG. 4C, programmable components B and G have been swapped between PLD regions 11 and 21. Accordingly, updated RSI values and cost values have been calculated for PLD regions 11 and 21 as shown in FIG. 4C. Because this move results in a reduction in the total cost value (e.g., from 440 to 0), system 120 accepts the move.

Figure 4D:
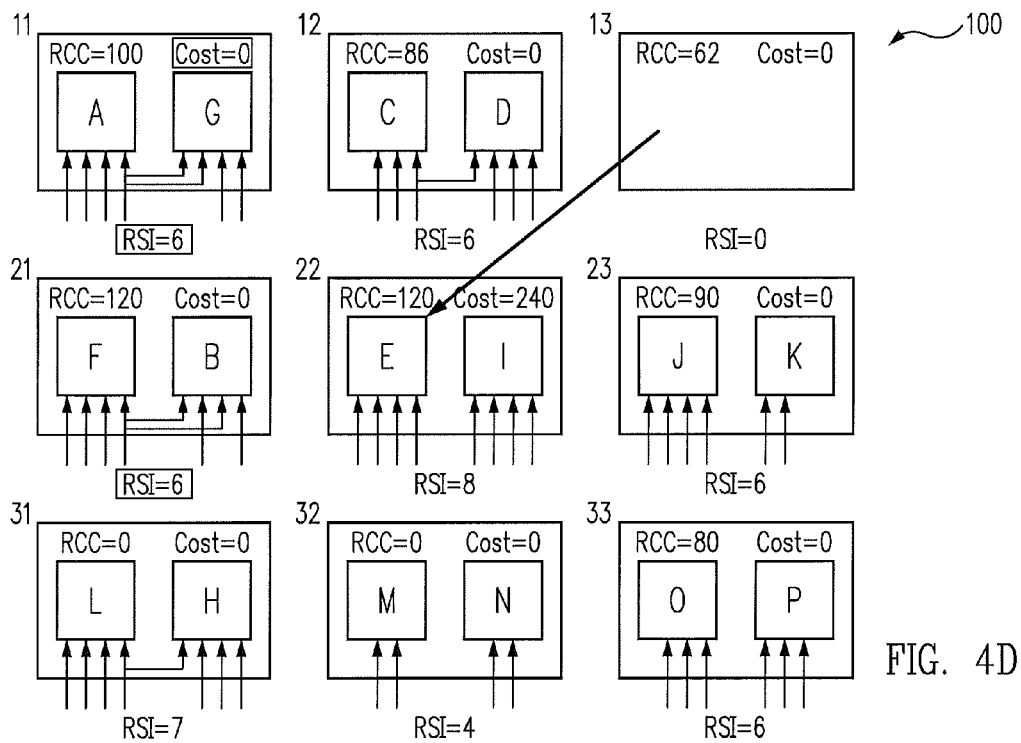

FIG. 4D illustrates an example of a placement of PLD components after an additional iteration of steps 345-355 is performed on the previous example shown in FIG. 4C. As identified in FIG. 4D, programmable component E has been moved from PLD region 13 to PLD region 22. Accordingly, updated RSI values and cost values have been calculated for PLD regions 13 and 22 as shown in FIG. 4D. In this case, however, the total cost value of PLD 100 has increased from 0 to 240 as a result of the move. Because this move results in an increase in the total cost value, system 120 may apply additional simulated annealing criteria in step 360 when choosing whether to accept or reject the move. For example, in one embodiment, system 120 may apply the following criteria:

$$\text{If } R > e^{-\Delta cost/T}, \text{ reject move} \qquad \text{(equation 7)}$$

$$\text{If } R \leq e^{-\Delta cost/T}, \text{ accept move} \qquad \text{(equation 8)}$$

In equations 7-8, R is a random number between 0 and 1 selected by system 120, $\Delta$cost is the change in the total cost value resulting from the move, and T is the current temperature value of the simulated annealing process. Accordingly, it will be appreciated that where $e^{-\Delta cost/T}$ is close to 1 (e.g., where $\Delta$cost is small or T is large), there is a high likelihood that R will be less than $e^{-\Delta cost/T}$ and that the move will therefore be accepted. On the other hand, where $e^{-\Delta cost/T}$ is close to 0 (e.g., where $\Delta$cost is large or T is small), there is a high likelihood that R will be greater than $e^{-\Delta cost/T}$ and that the move will therefore be rejected. Accordingly, as the temperature value of the simulated annealing process approaches the final temperature, moves that result in an increase in cost will become less likely to be accepted by system 120. In another embodiment, equations 7-8 may be modified such that then system 120 will reject the move if R is equal to $e^{-\Delta cost/T}$.

In the example of FIG. 4D, $\Delta$cost is 240 and the current temperature value is assumed to be 120. Thus, $e^{-\Delta cost/T}$ in this example corresponds to $e^{-240/120}$ which is approximately equal to 0.135. Thus, if R is 0.2, the move will be rejected. If R is 0.1, the move will be accepted.

In step 370, the current temperature value is reduced. If the current temperature reaches the final temperature value (step 375), then the process of FIG. 3 ends (step 390). Otherwise, the process continues to step 380.

In step 380, system 120 updates the congestion density estimates previously determined in step 325. In this regard, the congestion density of various PLD regions may change based on the changed positions of programmable components of PLD 100. In step 385, system 120 updates the RCC values using the updated congestion density estimates. Then, the process of FIG. 4 returns to step 345.

Figure 4E:
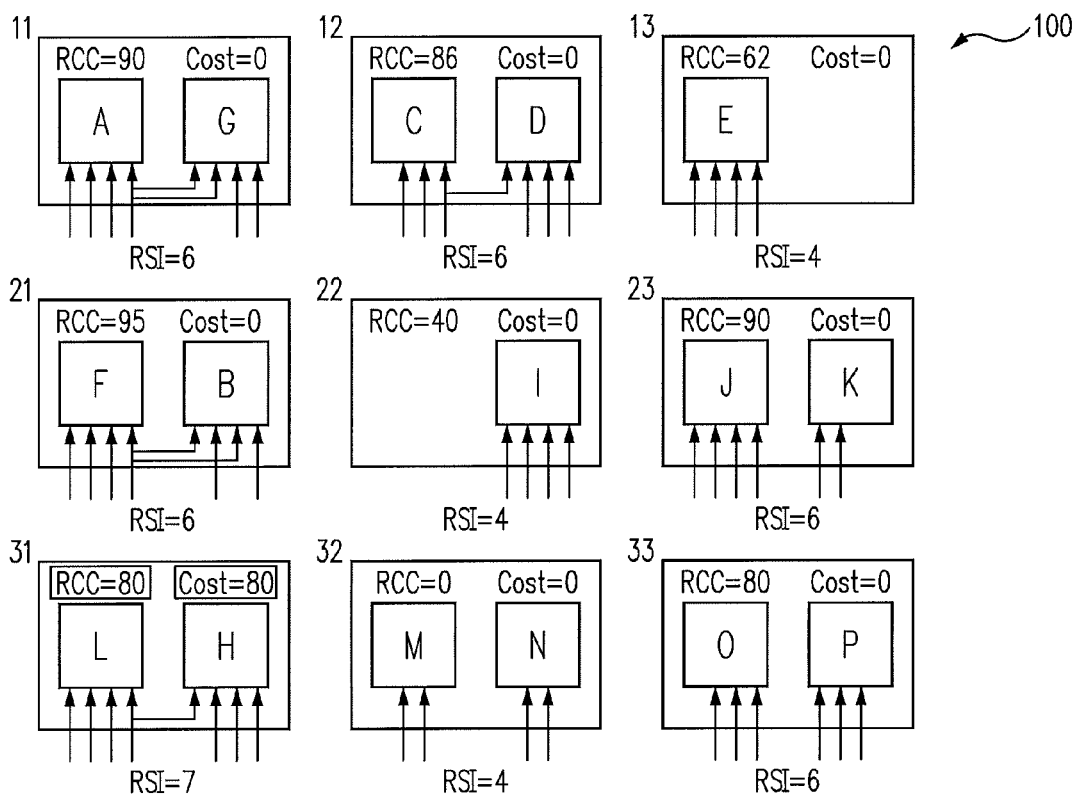

FIG. 4E illustrates an example of a placement of PLD components after steps 380-385 have been performed. As shown in FIG. 4E, the previous move of programmable component E from PLD region 13 to PLD region 22 suggested in FIG. 4D has not been accepted. As further shown in FIG. 4E, RCC values have been updated for PLD regions 21, 22, and 31. As also shown in FIG. 4E, the updated RCC value for PLD region 31 has resulted in a change in the cost value of PLD region 31.

Figure 5:
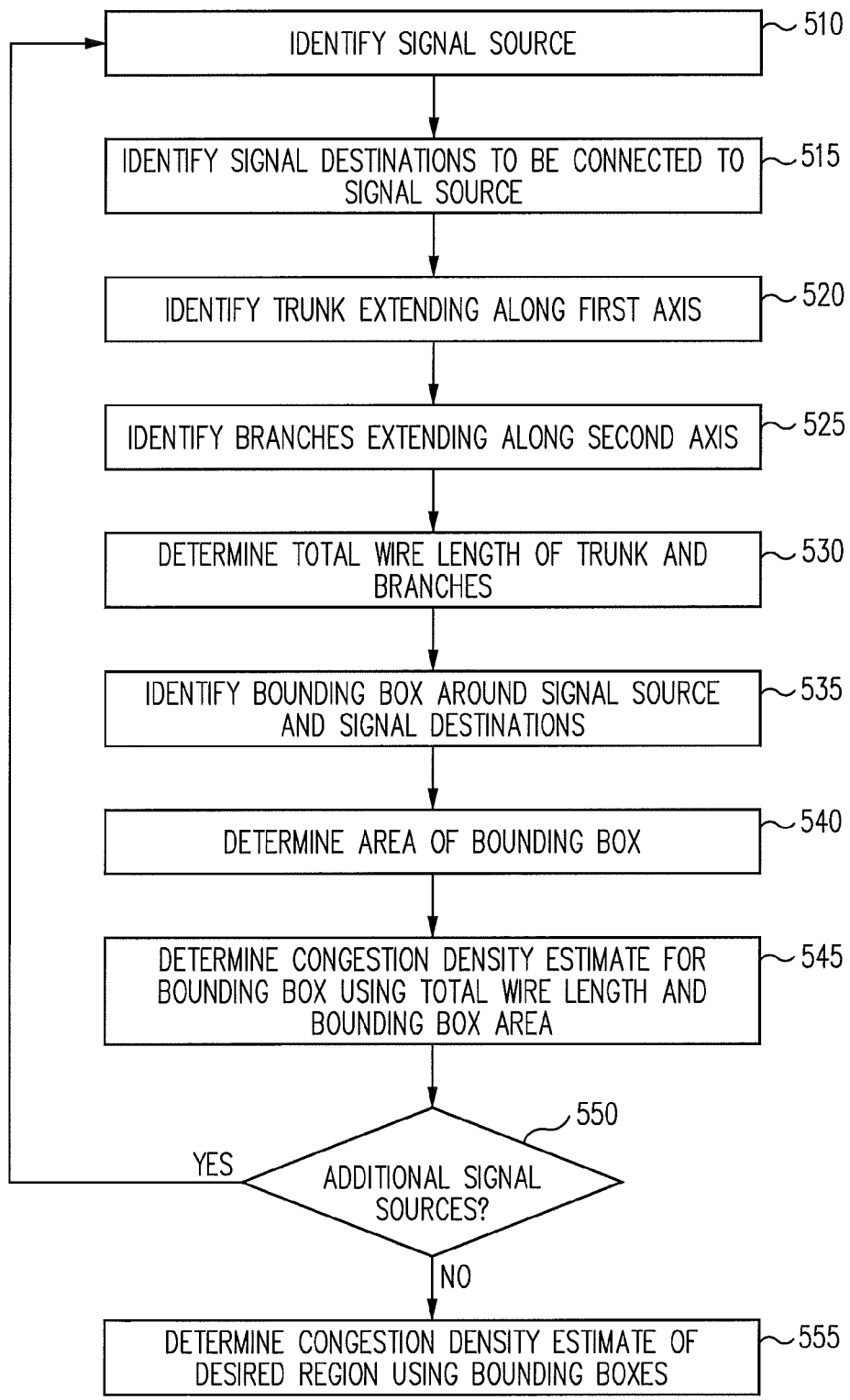
FIG. 5 illustrates a process for estimating congestion density of a region of a PLD in accordance with an embodiment of the invention.

FIG. 5 illustrates a process for estimating congestion density of a region of a PLD in accordance with an embodiment of the invention. For example, in one embodiment, the process of FIG. 5 may be performed by system 120 during steps 325 and 380 of the process of FIG. 3.

Figure 6A:
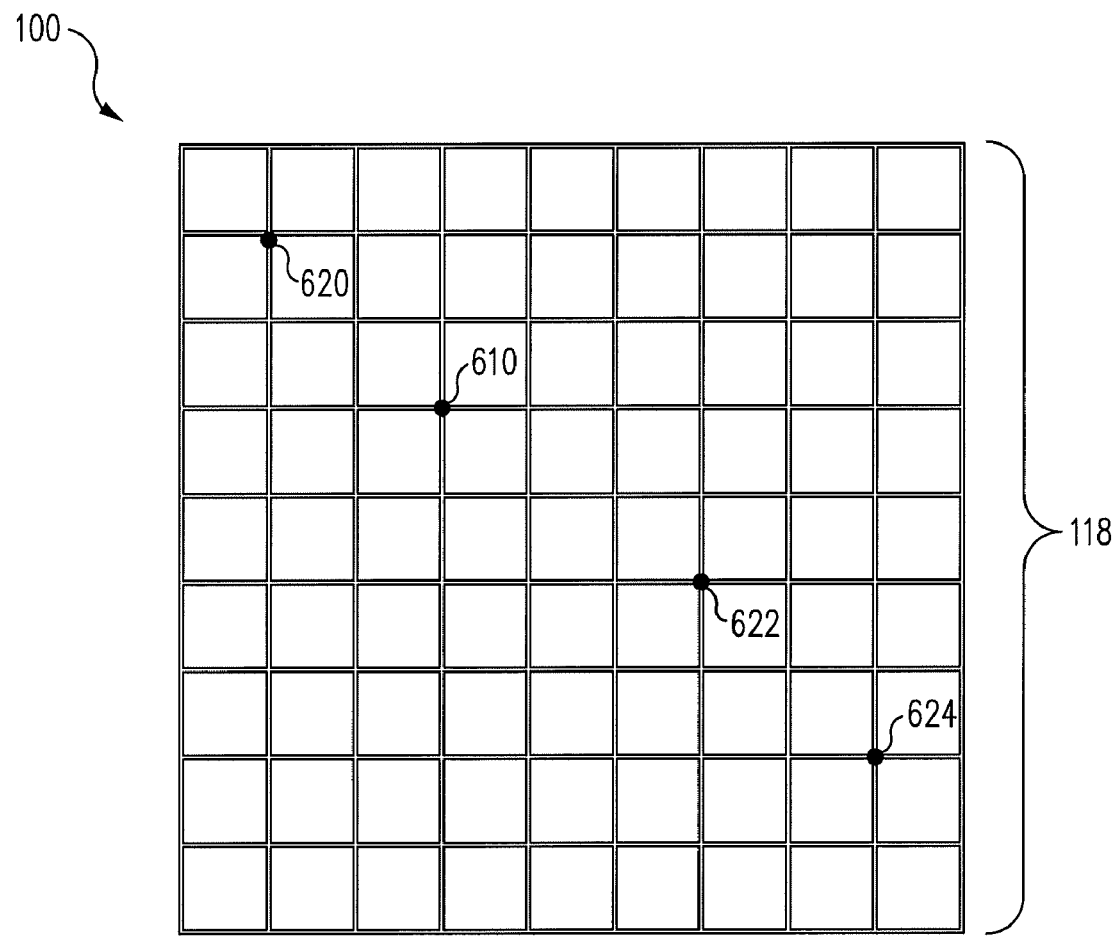
FIGS. 6A-C illustrate examples of nodes and signal paths identified during the process of FIG. 5 in accordance with embodiments of the invention.
Figure 6B:
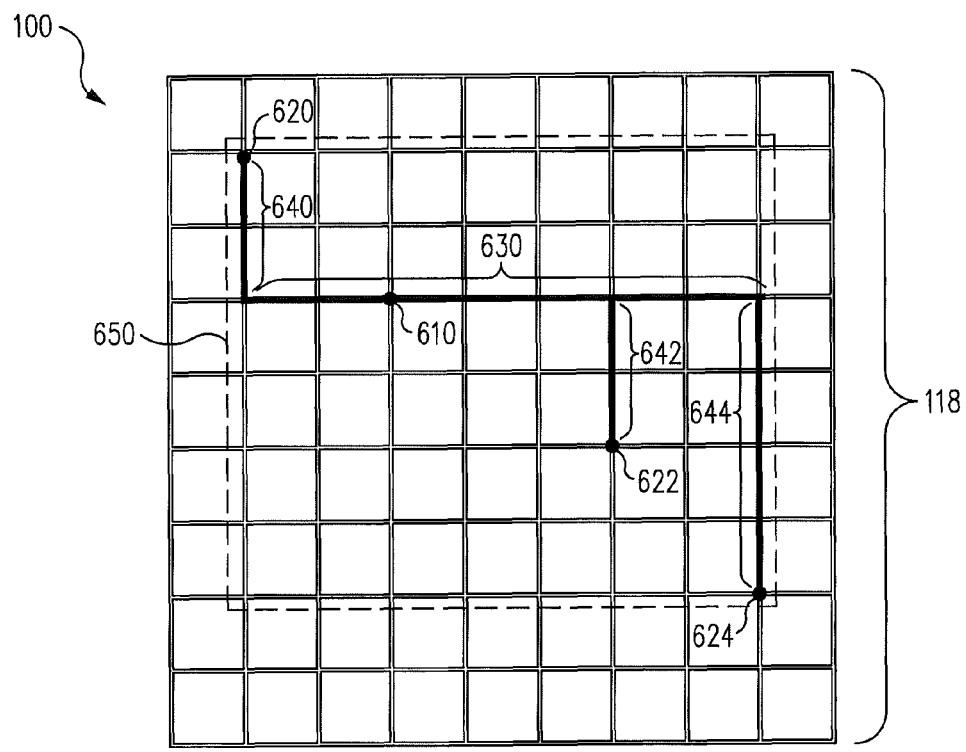
Figure 6C:
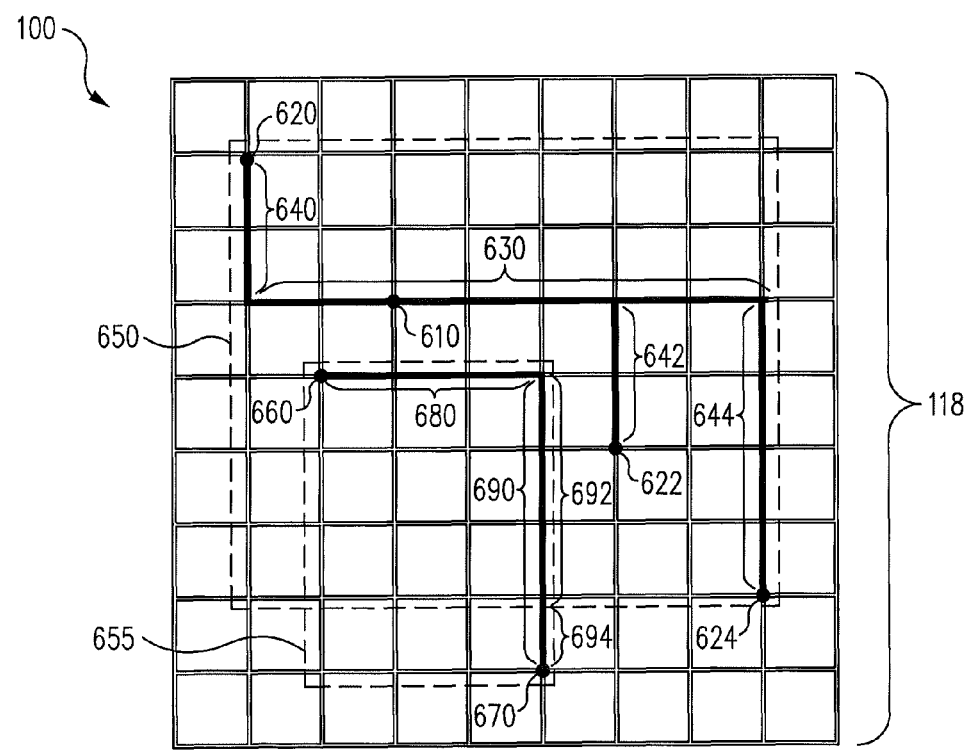

The process of FIG. 5 will be described with reference to FIGS. 6A-C which illustrate examples of various nodes and signal paths of PLD 100 identified during the process of FIG. 5 in accordance with embodiments of the invention. In this regard, FIGS. 6A-C provide conceptual representations of routing resources 118 of PLD 100 arranged as grids of wires which may be selectively interconnected to provide signal paths between PLD components at nodes 610, 620, 622, and 624, and also between PLD components at nodes 660 and 670.

In step 510, system 120 identifies a component of PLD 100 at node 610 which provides a signal to be connected to a plurality of other components of PLD 100. Accordingly, node 610 is referred to as a signal source.

In step 515, system 120 identifies components of PLD 100 at node 620, 622, and 624 to receive the signal provided by the signal source at node 610. Nodes 620, 622, and 624 are referred to as signal destinations.

In step 520, system 120 identifies a trunk 630 of connected wires extending along a first axis from signal source 610 toward signal destinations 620, 622, and 624. For example, as shown in FIG. 6B, trunk 630 extends from signal source 610 along a substantially horizontal axis toward signal destinations 620, 622, and 624. In another embodiment, trunk 630 may extend along a substantially vertical axis.

In yet another embodiment, system 120 may identify different trunks extending along horizontal and vertical axes and select the trunk having a shorter length. In a further embodiment, system 120 may identify different trunks extending along horizontal and vertical axes and select the trunk resulting in a shorter total wire length which will be further described herein.

In step 525, system 120 identifies branches 640, 642, and 644 of connected wires extending along a second axis from signal source 610 toward signal destinations 620, 622, and 624. For example, as shown in FIG. 6B, branches 640, 642, and 644 extend from trunk 630 along substantially vertical axes to connect trunk 630 to signal destinations 620, 622, and 624.

In step 530, system 120 identifies a total wire length of trunk 610 and branches 640, 642, and 644. For example, as shown in FIG. 6B, trunk 630 extends along seven connected wires (e.g., counting each square of routing resources 118 as one wire). As also shown in FIG. 6B, branches 640, 642, and 644 collectively extend along a total of eight connected wires. Accordingly, the total wire length of trunk 610 and branches 640, 642, and 644 is fifteen wires.

In step 535, system 120 selects a bounding box 650 around signal source 610 and signal destinations 620, 622, and 624. As shown in FIG. 6B, bounding box 650 also encompasses trunk 610 and branches 640, 642, and 644.

In step 540, system 120 determines an area of the region of PLD 100 encompassed by bounding box 650 (e.g., counting each square of routing resources 118 as having a length of one). As shown in FIG. 6B, bounding box 650 extends seven wire lengths in a horizontal direction and six wire lengths in a vertical direction. Accordingly, bounding box 650 has an area of 42 squares.

In step 545, system 120 determines a congestion density estimate for bounding box 650 using the total wire length and area previously determined in steps 530 and 540. For example, in one embodiment, the congestion density estimate may be calculated by dividing the total wire length by the area. Accordingly, in the embodiment shown in FIG. 6B, the congestion density estimate for bounding box 650 is approximately 0.36 (e.g., 15/42). As a result, the congestion density attributable to the signal source identified in step 510 (e.g., signal source 610 in this example) may be determined.

In step 550, system 120 determines whether PLD 100 includes additional signal sources which may be connected to additional signal destinations by routing resources 118. If additional signal sources exist, then the process of FIG. 5 repeats steps 510 to 545 for the signal sources. For example, a plurality of bounding boxes surrounding sets of the signal sources and signal destinations may be identified.

In this regard, FIG. 6C illustrates an additional signal source 660 connected to an additional signal destination 670 through a trunk 680 and a branch 690. As shown in FIG. 6C, the connected wires of trunk 680 and branch 690 provide a total wire length of seven wires. The area of the region of PLD 100 encompassed by a bounding box 655 is 12 squares. Accordingly, in the embodiment shown in FIG. 6C, the congestion density estimate for bounding box 655 is approximately 0.58 (e.g., 7/12).

After all signal sources have been considered, the process continues to step 555 where a congestion density estimate of any desired region of PLD 100 may be determined by summing the congestion density estimates of overlapping bounding boxes associated with the region. For example, in the embodiment shown in FIG. 6C, bounding boxes 650 and 655 overlap in a region 692. Accordingly, the congestion density estimate for region 692 will be 0.92 (e.g., the sum of congestion density estimates 0.36 and 0.58). As another example, only bounding box 655 overlaps another region 694. Therefore, the congestion density estimate for region 694 will be 0.58 (e.g., the congestion density estimate of bounding box 655). The congestion density estimates may also be scaled before further steps of FIG. 3 are performed. For example, in one embodiment, the congestion density estimates of regions 692 and 694 may be multiplied by 100 to provide integer values (e.g., 0.36 and 0.58 may be converted to 36 and 58).

The techniques described above with regard to signal sources and signal destinations in the process of FIG. 5 may be applied to the various signal paths and PLD regions of FIGS. 4A-E to determine congestion density estimates during steps 325 and 380. For example, the signal paths FIGS. 4A-E may be viewed as signal sources during the process of FIG. 5. Similarly, the PLD components of FIGS. 4A-E may be viewed as signal destinations during the process of FIG. 5. In this regard, it will be appreciated that large numbers of signal sources and signal destinations may be considered during the process of FIG. 5 to determine congestion density estimates for the PLD regions of FIGS. 4A-E.

In view of the above discussion, it will be appreciated that various techniques for reducing signal congestion reduction have been provided using a region-based approach. Advantageously, PLD regions having a high likelihood of signal congestion can be assigned to have a disproportionately high cost values through the selection of appropriate RSI_limit values and RCC values. Because moves that reduce the cost values of such regions are likely to be accepted by system 120, the overall signal congestion of PLD 100 can be reduced.

Moreover, because congestion density estimates need not be recalculated for every move (e.g., they may be recalculated in step 380 which is not required to be performed for every move), significant time and processing resources can be saved during the process of FIG. 3.

Embodiments described above illustrate but do not limit the invention. It should also be understood that numerous modifications and variations are possible in accordance with the principles of the present invention. Accordingly, the scope of the invention is defined only by the following claims.

What is claimed is:

1. A computer-implemented method of reducing signal congestion in configuration data that implements a circuit design in a programmable logic device (PLD), the method comprising:
    mapping in a computer a plurality of circuit components of the circuit design to a plurality of components of the PLD;
    placing in the computer the plurality of PLD components in the PLD, wherein each of the placed PLD components is associated with one of a plurality of regions of the PLD and with one or more unique signal paths entering the PLD region;
    determining in the computer a cost value for each PLD region associated with a placed PLD component based at least in part on the number of unique signal paths entering the PLD region from other PLD regions, wherein the cost value reflects the amount of signal congestion in the PLD region;
    selecting in the computer one of the PLD components to move from a first one of the PLD regions to a second one of the PLD regions;
    updating in the computer the cost values associated with the first and second PLD regions based on a change in the number of unique signal paths entering the first and second PLD regions; and
    selectively accepting or rejecting in the computer the move based at least in part on the updated cost values.

2. The method of claim 1, wherein the determining in the computer a cost value comprises assigning a cost value to each PLD region having a number of unique signal paths that exceeds a signal path limit value associated with the PLD region.

3. The method of claim 1, further comprising determining in the computer a congestion density estimate associated with each PLD region, wherein the cost value for each PLD region is further based on the congestion density estimate associated with the PLD region.

4. The method of claim 3, wherein the determining in the computer a congestion density estimate associated with each PLD region comprises:
    identifying in the computer a plurality of signal sources and a plurality of signal destinations associated with the PLD components;
    for each signal source, identifying in the computer a trunk of connected wires extending from the signal source toward one or more of the signal destinations;
    for each signal destination, identifying in the computer a branch of connected wires extending from the trunk to the signal destination;
    identifying in the computer a plurality of bounding boxes surrounding sets of the signal sources and signal destinations;
    determining in the computer a congestion density estimate associated with each bounding box; and
    determining in the computer the congestion density estimate associated with each PLD region using the congestion density estimates associated with bounding boxes associated with each PLD region.

5. The method of claim 4, wherein the determining in the computer a congestion density estimate associated with each bounding box comprises:
    determining in the computer a total wire length of the trunk and the one or more branches of the bounding box;
    determining in the computer an area of the bounding box; and
    dividing in the computer the total wire length by the area to obtain the congestion density estimate associated with the bounding box.

6. The method of claim 1, further comprising repeating the selecting, updating, and selectively accepting or rejecting for a plurality of different PLD components and a plurality of different PLD regions.

7. The method of claim 6, further comprising updating the congestion density estimates, wherein the cost values are updated more frequently than the congestion density estimates.

8. The method of claim 1, wherein the determining, selecting, updating, and selectively accepting or rejecting are part of a simulated annealing process.

9. The method of claim 8, further comprising repeating the selecting, updating, and selectively accepting or rejecting for a plurality of different PLD components and a plurality of different PLD regions until a temperature of the simulated annealing process reaches a minimum value.

10. A non-transitory computer readable medium on which are stored computer readable instructions for performing the method of claim 1.

11. A system comprising:
    one or more processors; and
    one or more memories adapted to store a plurality of computer readable instructions which when executed by the one or more processors are adapted to cause the system to perform a method of reducing signal congestion in a configuration of a programmable logic device (PLD), the method comprising:
    mapping a plurality of circuit components of a circuit design to a plurality of components of the PLD,
    placing the plurality of PLD components in the PLD, wherein each of the placed PLD components is associated with one of a plurality of regions of the PLD and with one or more unique signal paths entering the PLD region,
    determining a cost value for each PLD region associated with a placed PLD component based at least in part on the number of unique signal paths entering the PLD region from other PLD regions, wherein the cost value reflects the amount of signal congestion in the PLD region,
    selecting one of the PLD components to move from a first one of the PLD regions to a second one of the PLD regions,
    updating the cost values associated with the first and second PLD regions based on a change in the number of unique signal paths entering the first and second PLD regions, and
    selectively accepting or rejecting the move based at least in part on the updated cost values.

12. The system of claim 11, wherein the determining a cost value comprises assigning a cost value to each PLD region having a number of signal paths that exceeds a signal path limit value associated with the PLD region.

13. The system of claim 11, further comprising determining a congestion density estimate associated with each PLD region, wherein the cost value for each PLD region is further based on the congestion density estimate associated with the PLD region.

14. The system of claim 13, wherein the determining a congestion density estimate associated with each PLD region comprises:
- identifying a plurality of signal sources and a plurality of signal destinations associated with the PLD components;
- for each signal source, identifying a trunk of connected wires extending from the signal source toward one or more of the signal destinations;
- for each signal destination, identifying a branch of connected wires extending from the trunk to the signal destination;
- identifying a plurality of bounding boxes surrounding sets of the signal sources and signal destinations;
- determining a congestion density estimate associated with each bounding box; and
- determining the congestion density estimate associated with each PLD region using the congestion density estimates associated with bounding boxes associated with each PLD region.

15. The system of claim 14, wherein the determining a congestion density estimate associated with each bounding box comprises:
- determining a total wire length of the trunk and the one or more branches of the bounding box;
- determining an area of the bounding box; and
- dividing the total wire length by the area to obtain the congestion density estimate associated with the bounding box.

16. The system of claim 11, further comprising repeating the selecting, updating, and selectively accepting or rejecting for a plurality of different PLD components and a plurality of different PLD regions.

17. The system of claim 16, further comprising updating the congestion density estimates, wherein the cost values are updated more frequently than the congestion density estimates.

18. The system of claim 11, wherein the determining, selecting, updating, and selectively accepting or rejecting are part of a simulated annealing process.

19. The system of claim 18, further comprising repeating the selecting, updating, and selectively accepting or rejecting for a plurality of different PLD components and a plurality of different PLD regions until a temperature of the simulated annealing process reaches a minimum value.

20. A system for reducing signal congestion in a configuration of a programmable logic device (PLD), the system comprising:
- means for mapping a plurality of circuit components of a circuit design to a plurality of components of the PLD;
- means for placing the plurality of PLD components in the PLD, wherein each of the placed PLD components is associated with one of a plurality of regions of the PLD and with one or more unique signal paths entering the PLD region;
- means for determining a cost value for each PLD region associated with a placed PLD component based at least in part on the number of unique signal paths entering the PLD region from other PLD regions, wherein the cost value reflects the amount of signal congestion in the PLD region;
- means for selecting one of the PLD components to move from a first one of the PLD regions to a second one of the PLO regions;
- means for updating the cost values associated with the first and second PLD regions based on a change in the number of unique signal paths entering the first and second PLD regions; and
- means for selectively accepting or rejecting the move based at least in part on the updated cost values.

* * * * *